United States Patent
Von Ammon et al.

[11] Patent Number: 5,567,399
[45] Date of Patent: Oct. 22, 1996

[54] APPARATUS FOR PRODUCING A SINGLE CRYSTAL

[75] Inventors: Wilfried Von Ammon; Erich Dornberger, both of Burghausen; Herber Weidner, Haiming; Alfred Pardubitzki, Burghausen, all of Germany

[73] Assignee: Wacker Siltronic Gesellschaft fur Halbleitermaterialien AG, Burghausen, Germany

[21] Appl. No.: 592,072

[22] Filed: Jan. 26, 1996

[30] Foreign Application Priority Data

Feb. 2, 1995 [DE] Germany .......................... 19503357.4

[51] Int. Cl.⁶ ................................................. B01D 9/00
[52] U.S. Cl. ..................... 722/245.1; 117/217; 117/900; 373/158
[58] Field of Search .............................. 117/31, 200, 208, 117/213, 217, 900; 373/158; 422/245.1; 432/262

[56] References Cited

U.S. PATENT DOCUMENTS

| | | | |
|---|---|---|---|
| 2,707,719 | 5/1956 | Leibowitz | 422/245.1 |
| 3,265,469 | 8/1966 | Hall | 117/203 |
| 3,556,732 | 1/1971 | Chang et al. | 117/208 |
| 4,133,969 | 1/1979 | Zumbrunnen | 117/202 |
| 4,981,549 | 1/1991 | Yamashita et al. | 117/3 |
| 5,180,562 | 1/1993 | Drechsel et al. | 117/211 |
| 5,264,189 | 11/1993 | Yamashita et al. | 117/204 |
| 5,316,742 | 5/1994 | Tomioka et al. | 117/217 |
| 5,441,014 | 8/1995 | Tomika et al. | 117/31 |

FOREIGN PATENT DOCUMENTS

| | | |
|---|---|---|
| 0591525 | 4/1994 | European Pat. Off. . |
| 3905626 | 8/1989 | Germany . |

OTHER PUBLICATIONS

Patent Abstracts of Japan, vol. 40, No. 235 (G 366), Aug. 14, 1986.

*Primary Examiner*—R. Bruce Breneman
*Assistant Examiner*—Felisa Garrett
*Attorney, Agent, or Firm*—Collard & Roe, P.C.

[57] ABSTRACT

Apparatus for producing a single crystal of semiconductor material in accordance with the Czochralski method, has a cooling means which cools the growing single crystal and is constructed in two parts, The first is an upper part duct system through which a liquid coolant flows. The second is a lower part which is a heat-conducting cooling body.

7 Claims, 1 Drawing Sheet

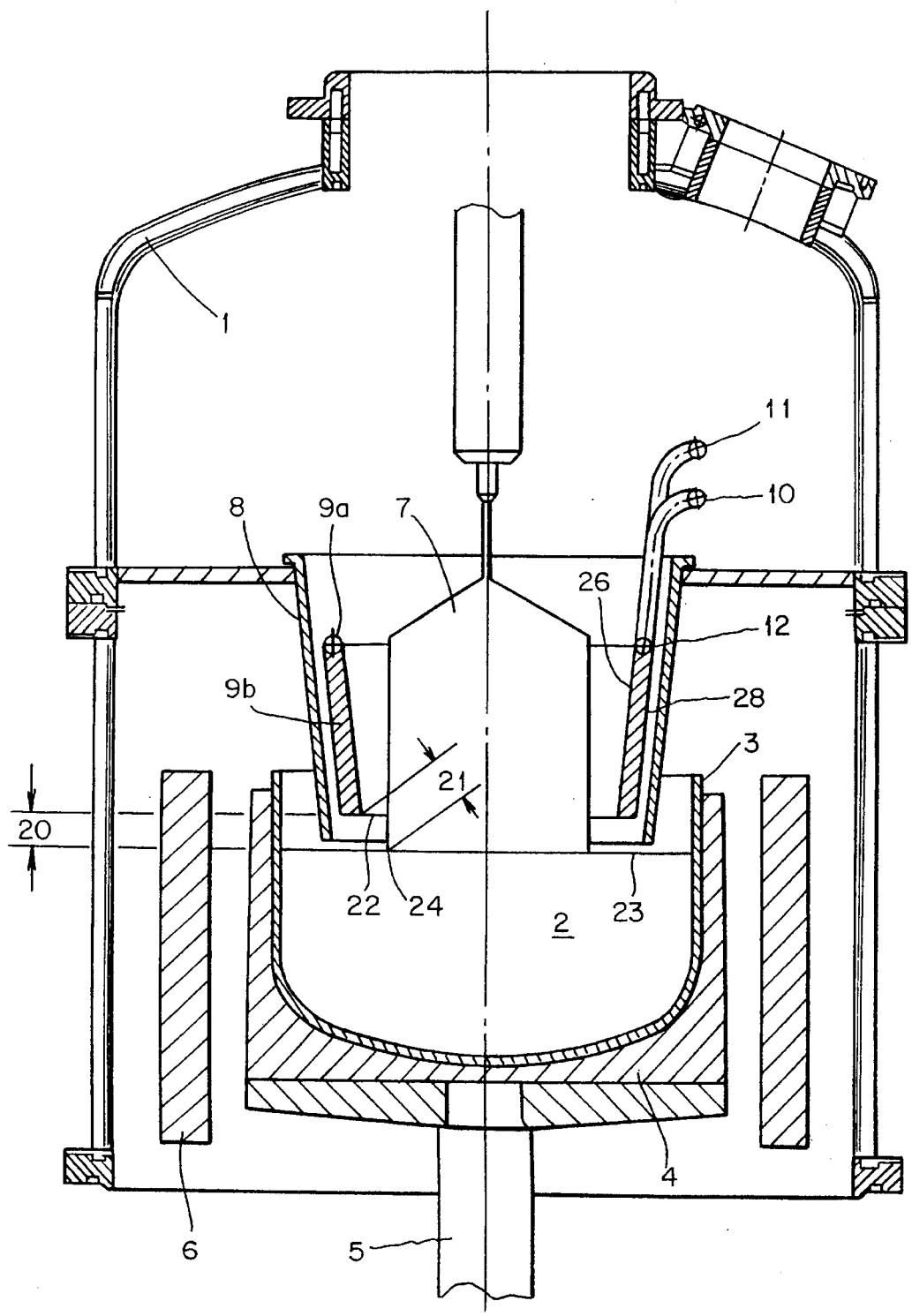

APPARATUS FOR PRODUCING A SINGLE CRYSTAL

BACKGROUND OF THE INVENTION

1. Field of the Invention

The present invention relates to an apparatus for producing a single crystal of semiconductor material in accordance with the Czochralski method.

2. The Prior Art

Such an apparatus is described in U.S. Pat. No. 5,316,742. It includes a crucible which is filled with molten semiconductor material. After immersion of a seed crystal, a rod-shaped single crystal is pulled from the melt. The crucible rests on an axially raisable and lowerable shaft which is raised while the single crystal is being pulled. This movement ensures that the axial position of the surface of the melt remains unchanged, even though the volume of the melt continuously decreases as a result of the growth of the crystal. An important feature of an apparatus of the above mentioned type is a heat shield which shields the growing single crystal against heat radiation which is radiated mainly by the crucible walls and a radiant heating element arranged laterally around the crucible. The heat shield held coaxially with respect to the single crystal extends close up to the melt surface and gives rise, in the region of the crystallization front of the single crystal, to a steep axial temperature gradient.

The temperature gradient is distinguished by a sharp drop in temperature between the crystallization front and the solid single crystal phase and is largely responsible for it being possible to pull the single crystal at a high rate. If, in addition to the heat shield, a cooling means is provided which effects cooling of the growing single crystal, it is possible to achieve particularly high pulling rates. Known cooling means comprise a duct system which surrounds the single crystal and has a liquid coolant flowing through it.

Embodiments in which the cooling means is extended as far as close up to the surface of the melt do, however, involve a high safety risk. A fault or failure of the system controlling the travel of the crucible may result in the cooling means being partially immersed in the melt and being destroyed, accompanied by coolant escaping and passing into the hot melt. The consequences of such an accident, which cannot be precluded, can be limited to an acceptable extent only by extensive and expensive safety measures. Embodiments in which the cooling means cannot be immersed in the melt even at maximum crucible travel do avoid the safety risk described. However, the distance between the cooling means and the surface of the melt remains comparatively large, and the effect of the cooling on the axial temperature gradient in the region of the crystallization front remains small.

SUMMARY OF THE INVENTION

It is an object of the present invention to provide a cooling means which ensures a high degree of safety and nevertheless gives rise to a steep axial temperature gradient in the region of the crystallization front of the single crystal.

This object is achieved according to the present invention by providing an apparatus for producing a single crystal of semiconductor material in accordance with the Czochralski method, comprising at least one heat shield which shields the growing single crystal, and a cooling means which cools the growing single crystal, wherein the cooling means is constructed in two parts, the first, upper part comprising a duct system through which a liquid coolant flows, and the second, lower part being designed as a cooling body having high thermal conductivity.

The duct system comprises, for example, at least one annular or spirally or meandrously coiled cooling tube which has a liquid coolant flowing through it. The preferred coolant is water, since it has excellent cooling properties and is readily available. That duct of the duct system which is at the smallest distance from the surface of the melt must be at least sufficiently far away from the melt so as not to touch the melt when the melt-filled crucible has been raised to the achievable maximum height. In order, nevertheless, to be able to optimally utilize the cooling capacity generated by the duct system for the purpose of increasing the temperature gradient in the region of the crystallization front of the single crystal, the lower part of the cooling means comprises a cooling body having high thermal conductivity. Duct system and cooling body form a functional unit which is held coaxially with respect to the single crystal, surrounding it, and which comes up close to the surface of the melt and to the crystallization front of the growing crystal.

The gap between the bottom edge of the cooling body and the surface of the melt is preferably from 10 to 150 mm, particularly preferably 20 to 50 mm. The gap between the bottom edge of the heat shield and the surface of the melt is preferably from 5 to 100 mm particularly preferably from 10 to 20 mm. Preferably, the diameter of the cooling body decreases toward the melt. The gap between the bottom edge of the cooling body and the crystallization front is preferably from 25 to 60 mm.

The cooling body must be made of a material having high thermal conductivity, and the material must not contaminate either the melt or the single crystal. The specific thermal conductivity of the material should correspond at least to that of copper. In the preferred embodiment, the cooling body is made of silver or is at least coated with silver. According to a further embodiment provision is made for the cooling body's inside surface, which faces the single crystal, being blackened, so that incident heat radiation is absorbed. The cooling body's outside surface, which faces the heat shield, is preferably constituted in such a way that incident heat radiation is reflected. This can be achieved, for example, by bright-finishing this side or by coating this side with a gold film.

It is necessary to ensure largely unimpeded heat conduction between the duct system and the cooling body. This condition is met, for example, if the cooling means is made in one piece. It is sufficient, however, for the duct system and the cooling body to be in areal contact and for the cooling body to be fastened to the duct system. Possible fastening means are, for example, screws or bolts, rivets, staples and soldered or welded joints. Particular preference is given to a fastening which is releasable as a function of the temperature and which automatically comes undone at a specific temperature, for example the boiling temperature of the coolant. One suitable example is fastening by a solder which melts at the temperature in question. As soon as, owing to a fault in the control of the crucible travel, the cooling body of the cooling means is immersed in the melt, the solder is heated so strongly that it melts. Thereupon the fastening comes undone and the cooling body, owing to its dead weight, will drop into the melt. Any further hazardous heating of the duct system of the cooling means is then no longer possible, given the interrupted heat conduction. This cooling body fastening which automatically comes loose as a function of the temperature is not absolutely necessary, however. After all, even without such a fastening enough time remains in the crisis situation described for countermeasures to be taken before that part of the cooling means which is equipped with the duct system is heated, as a result of heat conduction, to a critical temperature.

The cooling means may be mounted in a fixed position or so as to be axially raisable. Axial raisability is advantageous, for example, if it is necessary, at the commencement of producing the single crystal, to melt the semiconductor material already held in the crucible and if it is possible to remove the cooling means briefly from the heating zone, if the cooling means is not required for this initial operation.

BRIEF DESCRIPTION OF THE DRAWINGS

Other objects and features of the present invention will become apparent from the following detailed description considered in connection with the accompanying drawing which discloses the embodiment of the present invention. It should be understood, however, that the drawing is designed for the purpose of illustration only and not as a definition of the limits of the invention.

The one FIGURE of the drawings shows a preferred embodiment of the invention in longitudinal cross section.

DETAILED DESCRIPTION OF PREFERRED EMBODIMENTS

Referring now in detail to the drawings, the FIGURE shows a receiver 1, which can be purged with inert gas and which accommodates a crucible 3 filled with molten semiconductor material 2 such as silicon. The crucible 3 and elements 4 supporting it are borne by a rotatable, axially movable shaft 5. To the side of the crucible 3 there are heating elements 6 which are employed for melting the semiconductor material. The rod-shaped single crystal 7 which is pulled from the melt 2 is surrounded by a heat shield 8. The heat shield 8 comprises a tube which is arranged coaxially with respect to the single crystal and which comes up close to the surface of the melt. Preferably, the diameter of the heat shield decreases toward the melt and the heat shield has, for example, a conical shape.

According to the invention, a cooling means 9a,b in two parts is made of a metal and is provided for cooling the single crystal. The upper part of the cooling means is formed by the duct system 9a and made of metal such as silver which has a liquid coolant such as water flowing through it. The coolant enters the duct system 9a through the inlet 10 and leaves it again through the return 11. In the figure the duct system is depicted as a cooling tube in the form of a ring, by which the single crystal is surrounded. The gap between the cooling tube 9a and the surface of the melt is chosen to be sufficiently large for the cooling tube to remain above the melt even when the crucible is fully filled with molten semiconductor material and has been raised to the maximum extent.

The cooling body 9b is made of a heat-resistant solid material having high thermal conductivity, such as metal like silver, which forms the lower part of the cooling means which comes up close to the surface of the melt. The cooling body 9b, like the heat shield, is constructed as a tube, is arranged coaxially with respect to the single crystal and preferably has a diameter tapered toward the melt. The duct system 9a and the cooling body 9b are in areal contact with one another and are linked by fastening means 12, such as a low-melting solder joint.

The gap 20 between the bottom edge of the cooling body 9b and the surface of the melt 23 is preferably from 10 to 150 mm.

The gap 21 between a bottom edge 22 of the cooling body 9b and a crystallization front 24 of the growing single crystal 7 is preferably from 25 to 60 mm.

The cooling body 9b has an inside surface 26, which faces the single crystal 7, and which inside surface 26 is a heat radiation-absorbing surface. The cooling body 9b has an outside surface 28 situated opposite the inside surface 26, and the outside surface 28 is a heat radiation-reflecting surface.

The advantages of the invention are as follows. Because the duct has liquid coolant flowing through it, and since this duct cannot possibly come into contact with the melt, with coolant escaping, it is possible to dispense with such expensive safety features for the apparatus as would have to be provided in order to be prepared for such a malfunction. In addition, the invention ensures equally effective cooling of the growing single crystal in comparison to prior art apparatus which do, however, involve a high operational risk.

While only a single embodiment of the present invention has been shown and described, it is to be understood that many changes and modifications may be made thereunto without departing from the spirit and scope of the invention as defined in the appended claims.

What is claimed is:

1. An apparatus for producing a single crystal of semiconductor material in accordance with the Czochralski method, comprising at least one heat shield which shields a growing single crystal, and a cooling means which cools the growing single crystal, wherein the cooling means is constructed in two parts, with a first upper part comprising a duct system through which a liquid coolant flows, and with a second lower part comprising a cooling body having high thermal conductivity.

2. The apparatus as claimed in claim 1, wherein the lower part of the cooling means is fastened to the upper part by a low-melting solder joint.

3. The apparatus as claimed in claim 1, wherein the coolant is water.

4. The apparatus as claimed in claim 1, wherein the lower part of the cooling means is a cooling body made of silver.

5. The apparatus as claimed in claim 1, wherein the lower part of the cooling means is a cooling body coated with silver.

6. The apparatus as claimed in claim 1, wherein there is a gap between a bottom edge of the cooling body and a crystallization front of the growing single crystal which gap is from 25 to 60 mm.

7. The apparatus as claimed in claim 1, wherein the cooling body has an inside surface, which faces the single crystal, and which inside surface is a heat radiation-absorbing surface; and said cooling body has an outside surface situated opposite said inside surface, and said outside surface is a heat radiation-reflecting surface.

\* \* \* \* \*